United States Patent [19]
Lacan et al.

[11] 3,939,382
[45] Feb. 17, 1976

[54] CHASSIS INTENDED TO HOLD ELECTRONIC CIRCUITS

[75] Inventors: Guy Lacan, Carrieres Sous Bois; Yves Oehlert, Rueil Malmaison, both of France

[73] Assignee: Le Telemecanique Electrique, Nanterre, France

[22] Filed: Apr. 5, 1974

[21] Appl. No.: 458,147

[30] Foreign Application Priority Data
Apr. 12, 1973 France .................... 73.13357

[52] U.S. Cl. .................... 317/101 DH; 211/41
[51] Int. Cl.² ............................ H02B 1/02
[58] Field of Search ....... 317/101 DH; 211/41, 183, 211/184; 339/176 MP, 17 L, 17 LM, 17 M

[56] References Cited
UNITED STATES PATENTS

| | | |
|---|---|---|
| 3,360,689 | 12/1967 | Haury .................... 339/17 LM |
| 3,476,982 | 11/1969 | Bell et al. .................... 317/101 DH |
| 3,511,385 | 5/1970 | Ayling .................... 317/101 DH |
| 3,691,430 | 9/1972 | Freltag .................... 317/101 DH |
| 3,711,814 | 1/1973 | Pomella et al. .................... 317/101 DH |

*Primary Examiner*—David Smith, Jr.
*Attorney, Agent, or Firm*—William Anthony Drucker

[57] ABSTRACT

The invention relates to a chassis intended to hold electronic modules which use printed circuit boards. The chassis includes upper and lower supports for the boards which have slide-ways to guide the boards, and also serve to align connectors and secure them to front and rear upper and lower cross-pieces of the chassis. The supports snap or latch onto the cross-pieces by means of mouths which are orientated at right-angles to one another. The chassis may be employed in industrial automation control systems.

4 Claims, 7 Drawing Figures

CHASSIS INTENDED TO HOLD ELECTRONIC CIRCUITS

The invention relates to a chassis intended to hold electronic circuits, and in particular circuits laid out on printed circuit boards.

This type of chassis is used, in particular, in equipment such as that employing digital techniques and logic circuits for processing data for the purposes of process automation, and the automatic control of industrial plant and computer systems.

Chassis intended for holding printed circuit boards are known which consist of two side-walls joined together by two upper cross-pieces and two lower cross-pieces, each of which has regularly spaced openings along it to receive members for aligning or locking detachable horizontal supports. The function of the supports is to guide the circuits and their connections to connectors which are attached vertically to the rear upper cross-piece and the rear lower cross-piece, and to hold them in position there.

In this known arrangement, the openings are usually enclosed, and may be square or circular, and are cut out of the walls of the cross-pieces. The stresses generated when these openings are made always result in the material being stretched locally, and this is often the cause of the cross-piece deforming, especially if the openings are not made on the neutral axis.

Also, since the connectors attached to the cross-pieces need to line up exactly with the contacts on the printed circuit boards, a second series of openings has to be made at a very precise distance from the first series of openings to allow the connectors to be attached. All the openings have to be made to close tolerances to prevent any misalignment which might result from inaccurate assembly.

It is clear that it will be all the more difficult to fit the various parts into the openings when they are made to close tolerances and, if it is also borne in mind that the cross-pieces have additional openings to allow them to be fixed to the side-walls of the chassis, it will be realised this sort of equipment is costly and takes a long time to assemble.

Therefore, it is an object of the invention to provide a chassis which is of similar dimensions, but in which the number of openings to be made is considerably reduced, in which alignment between the connectors and the printed circuit boards is ensured in a simple but positive fashion, and in which the openings which are made are of a form which reduces any deformations in the cross-pieces and which allows the openings to be used to fix the said cross-pieces to the side-walls of the chassis.

In accordance with the invention this object is mainly achieved by virtue of the fact that the openings are formed by open parallel grooves, the fact that the members for aligning each support are represented by two ribs which co-operate with the grooves in either the upper or lower cross-piece, and the fact that the end of each support adjacent the connector incorporates means which, on the one hand, enable it to line the connector up with itself and, on the other hand, enable it to press the said connector against a rear cross-piece.

In accordance with additional features which strengthen the cross-pieces and economise on the means of attaching them, the grooves are formed perpendicularly to the axes of the cross-pieces in the two parallel limbs of a shaped member of generally F-section which forms each cross-piece, while the same grooves which are intended to align the supports are also used to hold brackets having projections, which brackets are fitted between the parallel limbs of the cross-pieces with a view to securing the latter against the side-walls of the chassis or slide-out rack.

In order that the invention may be more readily understood, reference will now be made to the accompanying drawings, in which.

Figure 1:
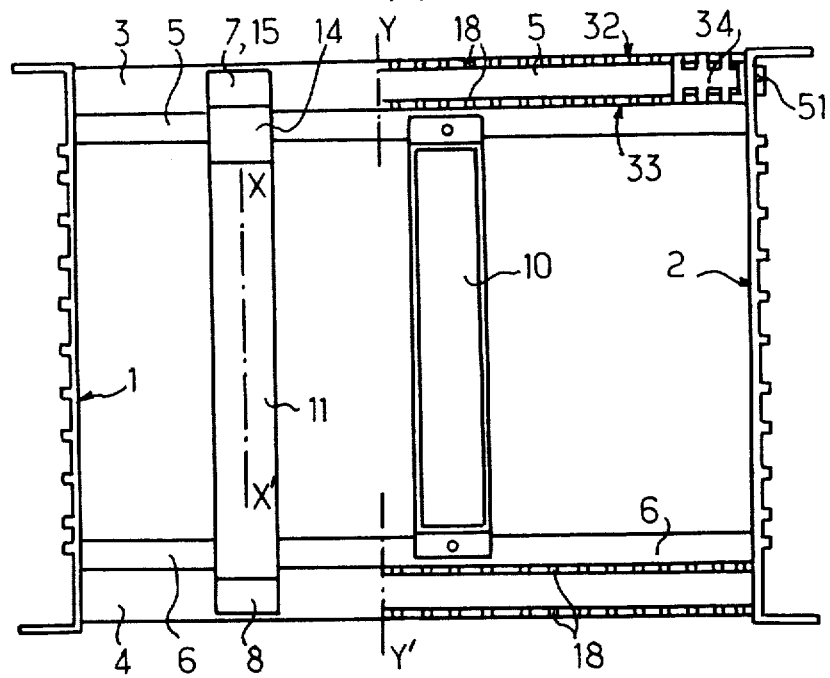
FIG. 1 is a front view, partly or section, of a chassis or slide-out rack according to one embodiment of the invention.

In FIG. 1, which shows the rack or chassis in elevation, the space within the chassis is defined by two side-walls 1 and 2 which are joined together by two parallel upper cross-pieces 3 and 5 and two parallel lower cross pieces 4 and 6. In the right-hand half of FIG. 1, the front upper and lower cross-pieces 3 and 4 respectively have been broken away to expose the corresponding rear upper and lower cross-pieces 5 and 6 respectively (see also FIG. 2).

Indicated at 11 is the front panel of an electronic module which has been inserted into the chassis in a direction perpendicular to the plane of FIG. 1, and which is guided and held by two supports 7 and 8. Connectors such as the connectors 10, shown in the right-hand half of FIG. 1, are applied against the rear cross-pieces 5 and 6 in alignment with the electronic modules.

Figure 2:
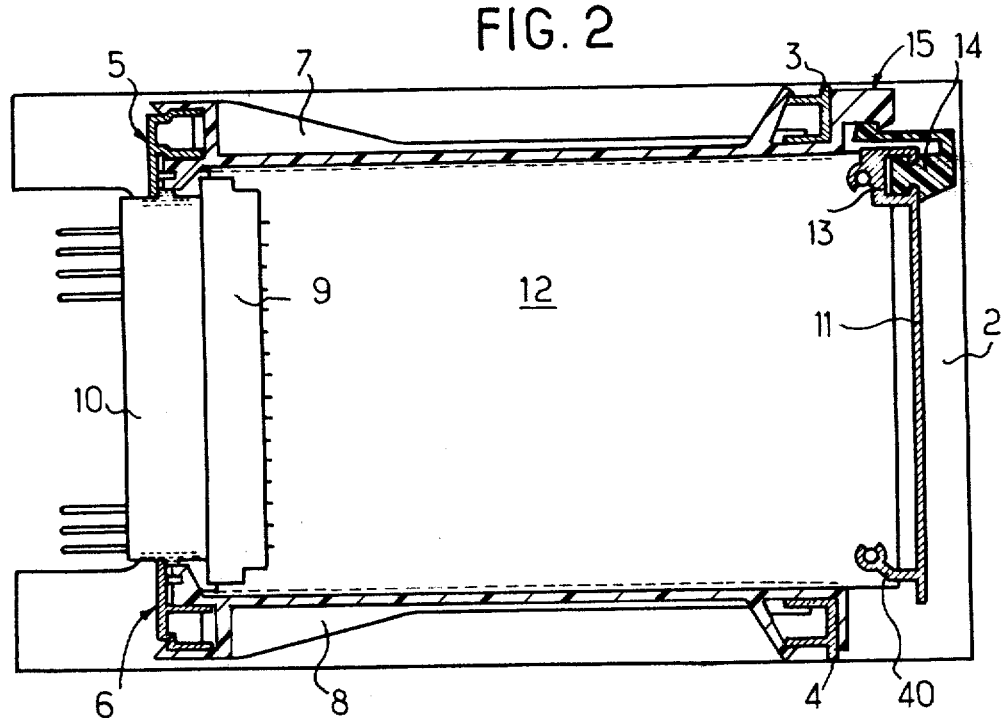
FIG. 2 shows the same chassis viewed from the left-hand side on FIG. 1, and sectioned along line XX' of FIG. 1.

As will be more readily seen from FIG. 2, the front panel 11 of the electronic module has two clips 40 and 13 which are secured to a printed circuit board 12, whilst the rear section of the circuit board incorporates a socket 9 intended to co-operate with the connector 10. On its rear or left hand face, the connector 10 has pins intended to be connected to the pins of neighbouring connectors. The upper and lower supports 7 and 8 are each formed therein with a slide-way 36, shown in FIG. 4, to hold one of the opposite edges of the circuit board 12, so as to slidably receive and guide the circuit board.

Figure 3:
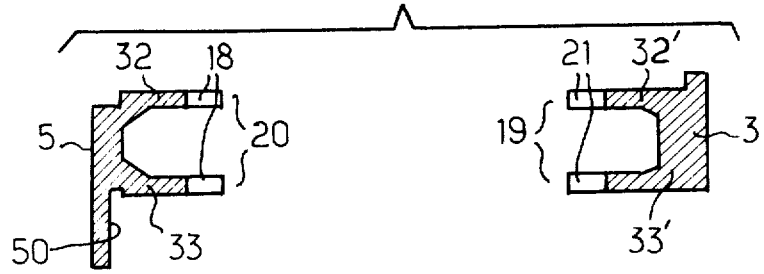
FIG. 3 is a sectional view of the upper cross-pieces, the rear cross-piece being on the left, and the front cross-piece being on the right.

As can be seen from FIGS. 2 and 3, the cross-pieces 3, 4, 5 and 6 are profiled members of generally F-shaped cross-section which are produced, for example, by extrusion. The rear upper and lower cross-pieces 5, 6 are formed by mutually identical profiled members which have two parallel limbs 32 and 33, and a vertical wall 50. The front upper and lower cross-pieces 3 and 4 are similar to the other cross-pieces, and have limbs 32' and 33', and they are so arranged that the channels 20 and 19 formed respectively by the limbs of the two cross-pieces 5 and 3 face or open towards one another.

In the limbs 32 and 33, or 32' and 33', are formed regularly spaced parallel grooves 18 and 21 respectively, as will also be seen from FIG. 1. In a preferred embodiment, these grooves are perpendicular to the axes of the cross-pieces and are spaced apart by a distance of 5.08 mm.

The lower and upper supports (8 and 7 respectively) are so shaped that they are substantially symmetrical with respect to a horizontal plane passing between them, except for a hook 15 which is provided only on the upper support 7. This hook is intended to engage with another hook 14 which is secured to the front panel 11 of the module, in order to lock the module in place.

Figure 4:
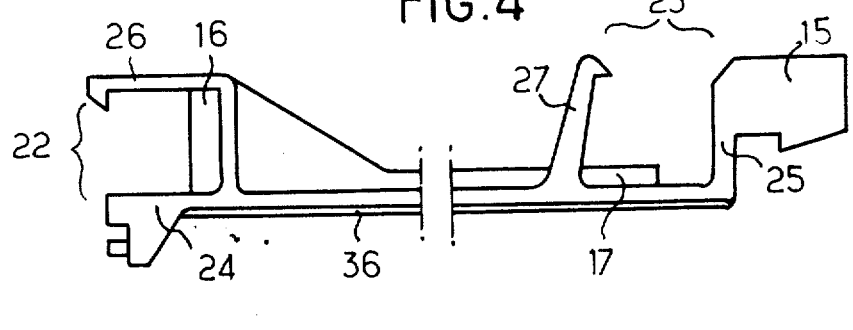
FIG. 4 is a side-view of the board support which is intended to be attached to the parts of the cross-pieces shown therebeneath.

In the following description, only the upper support shown in FIG. 4 will be described in detail. This latter support has mouths 22 and 23 at its front and rear ends respectively, one of the jaws 24 or 25 respectively of which possesses a certain amount of rigidity, while the opposite jaw 26 or 27 respectively possesses a certain amount of resilience. Each of the two latter jaws has a locking catch. It will be noted that the pairs of jaws forming these mouths are arranged, or open in directions, at right angles to one another. Two ribs 16 and 17 extend across the mouths 22 and 23 respectively, the width of these ribs being close to that of the grooves 18, 21. A support 7 or 8 is placed in position, firstly by fitting or springing the jaw 22 over the limbs 32 and 33 of an associated upper or lower rear cross-piece respectively in such a way that the rib 16 enters a groove 18, and by then pivoting the front end of the support 7 upwards (or the support 8 downwards) so that jaw 23 will engage around the front cross-piece 3 (or 4), and rib 17 will enter a corresponding groove 21. The supports remain in position due to the latching action of the resilient jaws 26 and 27 on the cross-pieces.

It will be seen that this method of attachment and guidance allows the supports to expand, and thus prevents them from deforming when affected by temperature.

Figure 5:
FIG. 5 shows, in detail, how the rear end of the support aligns the connector and holds it in place.
Figure 5:
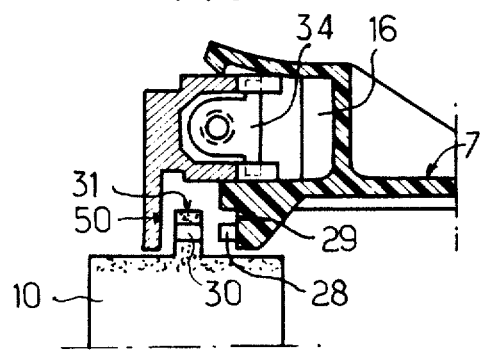

One way of attaching a connector 10, and of aligning it with a module, is shown in FIG. 5. In this Figure, on the opposite side from the cross-piece 5, the rigid jaw 24 has a shoulder 29 which carries a boss or stud 28 which is preferably cylindrical. The size and position of the stud 28 and shoulder 29 are such that, if a connector 10 is placed against the walls 50 of two rear cross-pieces, fixing apertures 30 in its attachment lug 31 will be situated opposite the studs. Thus, upon fitting mouth 22 over the cross-piece 5, the stud 28 will enter the aperture 30 in the attachment lug 31 of the connector 10, and, in addition, the shoulder 29 will press the lug 31 against the wall 50.

There is, therefore, no necessity to provide apertures in the cross-pieces for the connectors to be attached to, and the connectors are precisely aligned without doing anything further.

Figure 7:
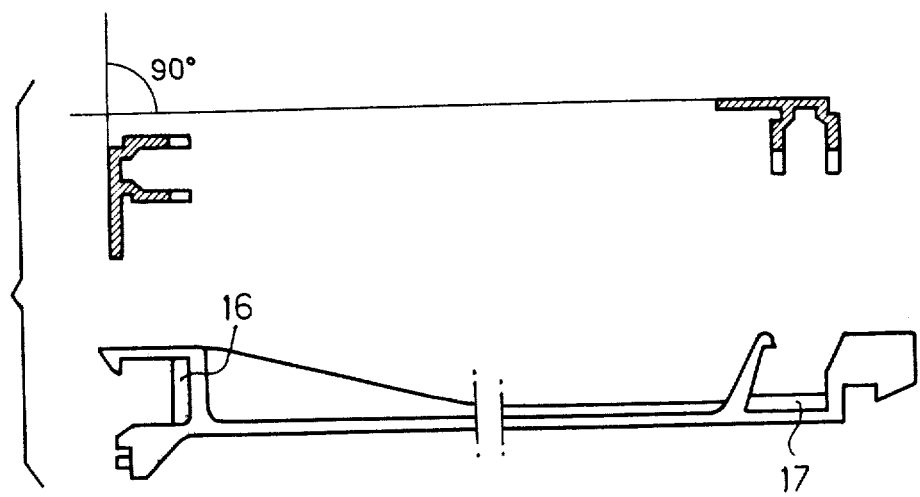
FIG. 7 shows a modification in which the front and rear cross-pieces are identical.

In the modification shown in FIG. 7, identical cross-pieces could be used, the angular position of the front cross-pieces with respect to the rear cross-pieces being displaced about a longitudinal axis by 90°.

Since the ends of the cross-pieces need to be rigidly attached to the walls 1, 2, the idea was conceived of taking advantage of the existence of the grooves, and of the fact that the cross-pieces form channels 19 and 20. For this purpose, brackets 35 and 34 are used which are shown in FIGS. 1 and 5, and in particular in FIG. 6.

The size of the brackets 35 and 34 is such that they can be introduced into the channels formed between the limbs of the cross-pieces, and these brackets have projections 37 and 38, and a threaded aperture 39.

Figure 6:
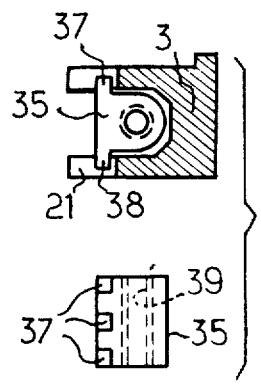
FIG. 6 is a side and a top view showing the form of the brackets for attaching the cross-pieces to the side-wall, and showing how they are fitted.

The top section of FIG. 6 shows that the projections 37 and 38 fit into the grooves 21, while FIG. 1, at the top right-hand side, shows how a bracket 34 is used to attach the end of a cross-piece against the wall 2 by means of a clamping screw 51.

We claim:

1. A rack for mounting circuit boards comprising: a pair of vertically spaced side walls, a first pair of vertically spaced cross-pieces attached to the respective side walls, a second pair of vertically spaced cross-pieces attached to the respective side walls and extending parallel to said first pair of cross-pieces, said first and second pairs of cross-pieces each having regularly spaced and inwardly facing grooves, said second pair of cross-pieces having inwardly facing extensions, a connector provided with first and second end projecting tongues, each of said projecting tongues being provided with an aperture, a plurality of pairs of support members each extending between the first and second pairs of cross-pieces, said support members being provided with opposed elongated grooves for the reception of circuit card edges and having projecting studs which removably engage the said apertures and shoulders which press the said projecting tongues against the said inwardly facing extensions, said support members further having vertically extending ribs which slidably and horizontally engage the grooves of the cross-pieces of the second pair and resilient jaws which grasp and hold the cross-pieces of the second pair, said support members further having further ribs which slidably and vertically engage the grooves of the cross-pieces of the first pair and further resilient jaws which grasp and hold the cross-pieces of the first pair.

2. A rack as claimed in claim 1, wherein each of the said support members has at each end thereof first and second jaws forming a clamping means, the first jaw being rigid while the second jaw is resilient and terminates in a locking catch, the said ribs and further ribs each extending across the said first and second jaws.

3. A rack as claimed in claim 1, wherein each of the cross-pieces has two parallel limbs integrally linked at one end by a bottom wall forming therewith a U-shaped channel, said limbs being provided at the other end thereof with the said regularly spaced grooves, the bottom walls of the cross-pieces of the second pair terminating in the said extensions which project from the U-shaped channel.

4. A rack as claimed in claim 3, further comprising brackets fitted into the said U-shaped channels, said bracket having parallel projections fitting into the regularly spaced grooves of the cross-pieces, and fastening means for removably attaching the said brackets to the side-walls of the rack.

* * * * *